(12) United States Patent
Leddige et al.

(10) Patent No.: US 6,539,449 B1
(45) Date of Patent: Mar. 25, 2003

(54) CAPACITIVELY LOADED CONTINUITY MODULE

(75) Inventors: Michael W. Leddige, Beaverton, OR (US); James A. McCall, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/524,850

(22) Filed: Mar. 14, 2000

(51) Int. Cl.[7] .............................................. G06F 13/00
(52) U.S. Cl. ...................... 710/306; 710/305; 710/300; 710/301
(58) Field of Search ................................ 710/300, 301; 702/117; 257/738; 361/777, 794; 439/326, 157, 60

(56) References Cited

U.S. PATENT DOCUMENTS

| | | | | |
|---|---|---|---|---|
| 4,946,403 A | * | 8/1990 | Billman et al. ............. | 439/326 |
| 5,590,030 A | * | 12/1996 | Kametani et al. ........... | 361/794 |
| 5,805,428 A | * | 9/1998 | Singer ........................ | 361/777 |
| 5,980,282 A | * | 11/1999 | Cheng ........................ | 439/157 |
| 6,095,821 A | * | 8/2000 | Panella et al. ................ | 439/60 |
| 6,204,559 B1 | * | 3/2001 | Lin et al. .................... | 257/738 |
| 6,266,730 B1 | * | 7/2001 | Perino et al. ................ | 710/300 |
| 6,324,485 B1 | * | 11/2001 | Ellis ........................... | 702/117 |
| 6,363,450 B1 | * | 3/2002 | Lash et al. ................... | 710/301 |

OTHER PUBLICATIONS

John W. Childers, CEO, Golden Gate Graphics; "Glossary of Printed Circuit Design and Manufacturing" 1999–2002 http://www.goldengategraphics.com/pcgloss.htm.*

* cited by examiner

*Primary Examiner*—Xuan M. Thai
*Assistant Examiner*—Benjamin Ortiz, Jr.
(74) *Attorney, Agent, or Firm*—Mark V. Seeley

(57) ABSTRACT

A continuity module for a memory channel for a computer system. The continuity module includes a connecting member for coupling the continuity module to a socket that is coupled to a motherboard. The continuity module also includes a printed circuit board, which is coupled to the connecting member. The printed circuit board includes a signal trace that is coupled to a capacitive load. In preferred embodiments, the capacitive load comprises a plurality of vias and/or stub traces, which are coupled to the signal trace.

2 Claims, 2 Drawing Sheets

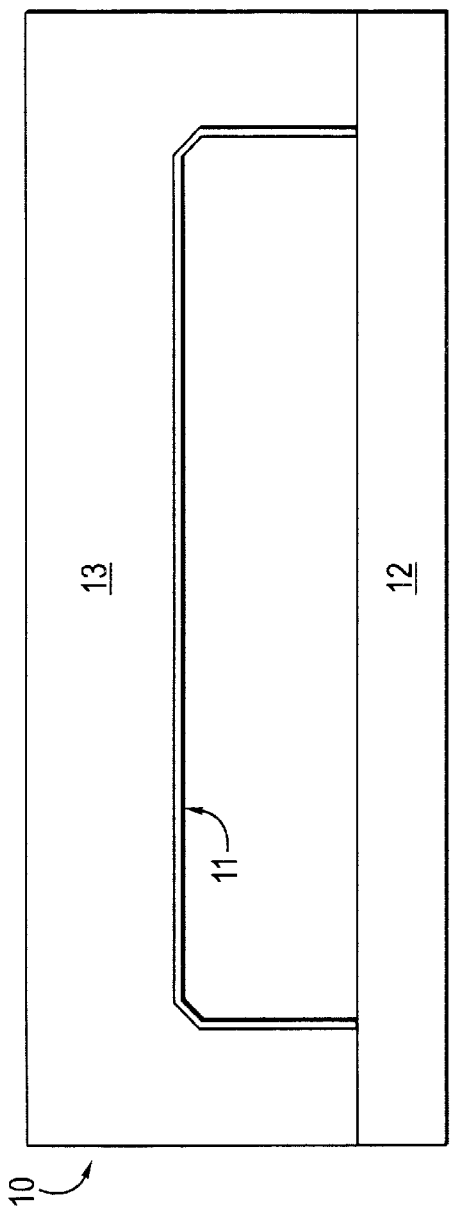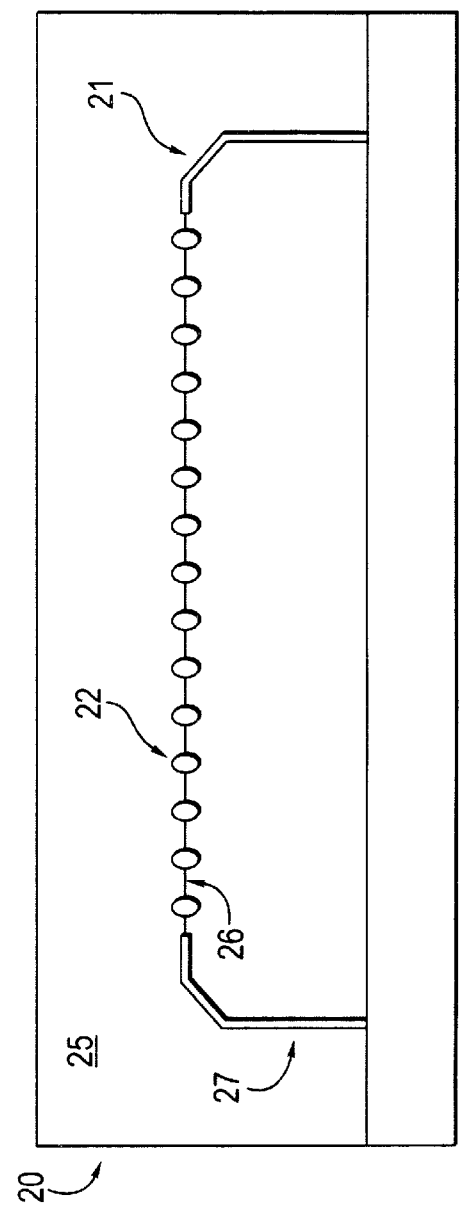

CAPACITIVELY LOADED CONTINUITY MODULE

FIELD OF THE INVENTION

The present invention relates to computer systems, in particular, systems that include a continuity module that has been inserted into a memory card slot.

BACKGROUND OF THE INVENTION

Certain computer systems may employ a serial bus to transmit signals between a memory controller and memory. An example of such a serial bus has been defined by Rambus Corporation of Mountain View, Calif. That bus, often called the Direct Rambus memory channel, enables transmission of high speed, pipelined signals between a memory controller and memory. A memory card or module coupled to the bus may contain a number of high speed DRAMs, which have a Rambus developed architecture. Such memory devices are often called "Rambus DRAMs" or "RDRAMs." Alternatively, DRAMs that have a different architecture may be coupled to the Direct Rambus memory channel—if accompanied by an appropriate translation mechanism for translating bus compatible signals to signals that are compatible with those DRAMs.

Systems that employ such a serial bus may include multiple sockets for receiving two or more memory modules or cards. On occasion, a system manufacture may not want to install memory cards into each of the sockets—either because the system manufacturer does not want to absorb the additional expense, or because an extra socket was provided to give the user an upgrade option. Because, however, such a serial bus requires signals to travel through all memory devices until terminated at the termination resistors, even sockets that do not receive a memory card must provide a pathway the enables those signals to complete their journey to the termination resistors. Inserting a continuity module in the socket—which includes traces that enable signals to pass through it, but does not include any memory devices—provides such a pathway. In essence, the continuity module provides a bridge between the memory controller, the memory modules, and the termination resistors.

Certain systems, which include a serial bus and two or more sockets for receiving memory modules or cards, may apply a relatively light capacitive load to the signal lines that extend from the memory controller to the termination resistors. Such a system may, for example, use one socket to receive a memory module that contains only four memory components and use the other socket to receive a continuity module. Because such systems apply such a light capacitive load to the signal line, much of the high frequency portion of fast edge rate signals may be transmitted along the signal line.

The high frequency spectral content of those signals may produce an undesirable amount of signal reflection. When the memory devices used in such a lightly loaded system are RDRAMs, such resonance behavior could augment a weakness in the RDRAM driver, which could cause a single-bit error to occur, when certain frequencies are applied.

One way to address this problem is to simply add more memory to the system. Adding memory adds capacitance to the signal lines, which helps attenuate the high frequency portion of these signals. Adding memory is not, however, an acceptable solution when the system design requires a small number of memory devices. Accordingly, there is a need for an alternative way to attenuate the high frequency portion of high speed, pipelined, fast edge rate signals that are driven along a serial bus used by a lightly loaded computer system. There is a need for such a system that increases the capacitive load applied to a signal line that couples a memory controller to memory devices, without adding memory. The present invention provides such a system.

BRIEF DESCRIPTION OF THE DRAWINGS

FIG. 1 is a schematic that represents a front view of a continuity module.

FIG. 2 is a schematic that represents a front view of an embodiment of the continuity module of the present invention.

DETAILED DESCRIPTION OF THE PRESENT INVENTION

Figure 3:
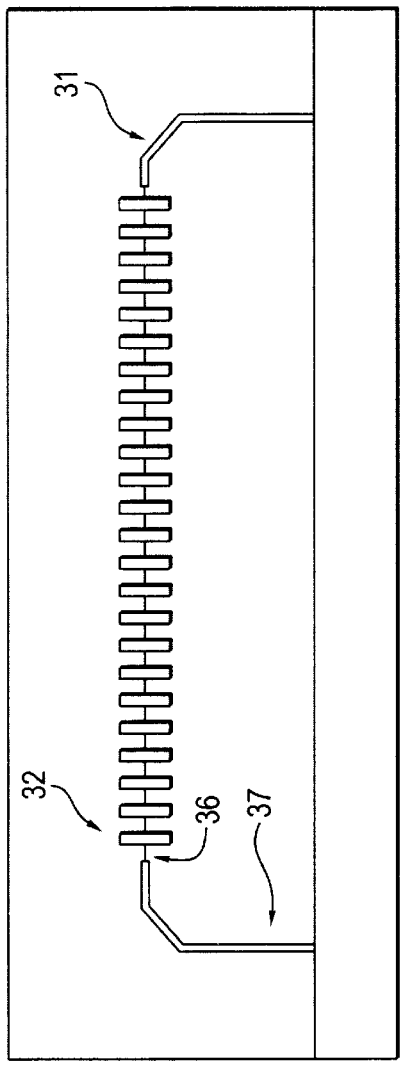
FIG. 3 is a schematic that represents a front view of another embodiment of the continuity module of the present invention.

A continuity module for a memory channel for a computer system is described. That continuity module includes a connecting member for coupling the continuity module to a socket, which is coupled to a motherboard. The continuity module also includes a printed circuit board that is coupled to the connecting member. The printed circuit board includes a signal trace, which is coupled to a capacitive load.

A number of embodiments of the present invention are described below with reference to FIGS. 1–4. In the following description, numerous specific details are set forth such as component types, dimensions, etc., to provide a thorough understanding of the present invention. However, it will be apparent to those skilled in the art that the invention may be practiced in many ways other than those expressly described here. The invention is thus not limited by the specific details disclosed below.

FIG. 1 represents a continuity module that does not include capacitively loaded traces. Continuity module 10 includes connecting member 12 and printed circuit board ("PCB") 13, which is coupled to connecting member 12. Connecting member 12 is used to couple continuity module 10 to a socket that is coupled to a motherboard. (Such a socket may receive either continuity module 10 or a memory module.) Signal trace 11 is routed over PCB 13, through either an internal or external PCB layer. (To simplify this description of the present invention, only one signal trace is shown here. Those skilled in the art will appreciate, however, that many such traces will traverse PCB 13 of module 10).

As shown, trace 11 has a substantially uniform width, for example, a width of approximately 0.014 inches. Trace 11 may have a substantially uniform impedance across the length of the module—except where bends exist and where the trace engages the card's edge fingers (i.e., that portion of the card that will connect to a socket mounted on a motherboard). Although such discontinuities may have little impact on the low frequency portion of signals transmitted over trace 11, they may cause the high frequency portion to be reflected. In addition, such discontinuities can cause that high frequency portion to produce undesirable cross-talk between adjacent traces that are located on continuity module 10.

Because trace 11 is not capacitively loaded, the degree to which the signal line is loaded depends upon the number of memory devices mounted to an adjacent memory module. For systems that include a small number of memory devices, that loading may not adequately dampen the channel to ensure proper system operation—especially when signals are transmitted across the channel at certain frequencies. Because adding memory to further dampen fast edge rate signals (by attenuating their high frequency portion) may not be a feasible option, the present invention enhances dampening of those signals by adding a capacitive load to the traces formed on the continuity module. The resulting device operates like a low pass filter—filtering out the signals' high frequency portion, and allowing the low frequency portion to pass.

By adding capacitive loading to traces formed on the continuity module, the edge rates of signals, which may be transmitted in a high speed, pipelined, fashion (e.g., the RSL signals that are transmitted over the Direct Rambus memory channel) will be slowed down. Slowing down the edge rates of those signals should lower cross-talk between adjacent traces. In addition, slowing down the edge rates of those signals should reduce undesirable signal reflections, which could otherwise have resulted because of impedance discontinuities. In effect, adding capacitance to traces formed on a continuity module further dampens the channel, helping to ensure that systems—which contain a relatively small number of memory devices—perform properly.

As shown in FIG. 2, capacitance may be applied to trace 21 of continuity module 20 by adding vias 22 to the trace. Vias 22 each include a via pad and a shaft (not shown) that extends from an internal (or external) layer of PCB 25 to another layer. Although in a preferred embodiment, signals passing along trace 21, from one side of each via pad to the other, will not pass through that shaft, the shaft may contribute, to some extent, to via 22's capacitance. Preferably, the capacitance that vias 22 add to trace 21 should sufficiently dampen the fast edge rate signals to eliminate (or at least reduce) undesirable resonance behavior.

Each via 22 may add between about 0.3 and about 0.7 picofarads of capacitance to trace 21. In a preferred embodiment, vias 22 add sufficient capacitance to the signal line to ensure that even the most lightly loaded system (e.g., one containing only four memory devices) will not be adversely affected by undesirable signal reflection. With this goal in mind, the total capacitance that vias 22 add to trace 21 is preferably between about 2 and about 10 picofarads. Adding this amount of capacitance to each trace 21 should sufficiently attenuate the high frequency portion of fast edge rate signals, which are driven along trace 21, to ensure that reflection of those signals will not adversely affect the performance of even lightly loaded systems. The magnitude of the increased capacitance that vias 22 generate may depend upon the diameter of the via pads; the diameter and length of the via shafts; the PCB stack-up (e.g., the number of PCB layers and the thickness of those layers); the material used to make the PCB; and the anti-pad diameter.

Although adding vias helps attenuate the high frequency portion of such signals, they can create impedance discontinuities for the signal line that passes through continuity module 20. The Direct Rambus memory channel enables 300 MHz, or higher, clock signals to be transmitted in a pipelined fashion. (Because data is taken off both the falling and rising edges of the clock signal, the data transfer rate may be 600M transfers, or more.) At such frequencies, variations in the impedance of a signal line, resulting from the vias' presence, may cause the transmitted signals to be reflected, which can degrade their quality.

To address this problem, this embodiment of the present invention raises the impedance of another portion of trace 21 to compensate for the reduced impedance at vias 22. This is done by forming a trace 21 that has relatively thin sections 26 located between relatively thick sections 27 and vias 22. Thin sections 26 provide a higher impedance than thick sections 27. Consequently, the impedance resulting from the combination of thin sections 26 and vias 22 can closely match the impedance of thick sections 27. In a preferred embodiment, a length and a thickness for thin sections 26 is chosen such that the impedance resulting from the combination of thin sections 26 and vias 22 is within about 5% of the impedance of thick sections 27. For example, in such a preferred embodiment, if the impedance of thick sections 27 is 28 ohms, then the average impedance of the section of trace 21 that is positioned between those thick sections is between about 26.6 and about 29.4 ohms. To obtain that result, thick sections 27 preferably should be between about 0.012 and about 0.016 inches thick, while thin sections 26 preferably should be between about 0.004 and about 0.005 inches thick. Thin sections 26 should separate thick sections 27 from vias 22 by a distance that ensures that the difference in impedance is less than about 5%.

When selecting an appropriate length and thickness for thin sections 26 to balance the reduction in impedance that vias 22 cause, a number of factors should be considered— such as, the impedance of thick sections 27 and vias 22, and the signal delay that thin sections 26 introduce. A length should be chosen for thin sections 26 that does not add an unacceptable amount of electrical delay. In a preferred embodiment, the length chosen should ensure that the increased delay resulting from the combination of sections 26 and vias 22 does not exceed one-half of the signal rise time ($T_R/2$).

When the average impedance from combining sections 26 and vias 22 is approximately equal to that of thick sections 27, the portion of trace 21 that lies between its thick sections may, for all practical purposes, be treated as an extension of thick sections 27. By inserting sections 26 between sections 27 and vias 22, vias can be added to trace 21 to help dampen fast edge rate signals by attenuating the high frequency spectral content of such signals, while ensuring that trace 21 will not exhibit significant impedance discontinuities. Such a compensated wiring technique thus enables placement of multiple vias on trace 21 to help reduce undesirable resonance behavior on the channel, without generating unwanted impedance discontinuities. Although this embodiment includes thin sections 26 to compensate for the impedance discontinuity that vias 22 cause, other embodiments may include vias 22 without further including thin sections 26.

FIG. 3 illustrates another embodiment of the present invention in which capacitance is added to trace 31 by forming stub traces 32 at spaced intervals along trace 31. The amount of capacitance each stub trace 32 adds to trace 31 may depend upon the depth, width and length of the stub trace, the PCB stack-up, and the material used to make the PCB. In a preferred embodiment, each stub trace 32 adds between about 0.3 and about 0.7 picofarads of capacitance to trace 31. The total capacitance added to trace 31 by all stub traces 32 preferably is between about 2 and about 10 picofarads. Like the embodiment shown in FIG. 2, trace 31 includes thin sections 36 that separate stubs 32 from thick sections 37. Optimally, the average impedance of that portion of trace 31 that is located between thick sections 37 matches the impedance of trace 31's thick sections. (In other embodiments, trace 31 may be coupled to stub traces 32 without including thin sections 36.)

Figure 4:
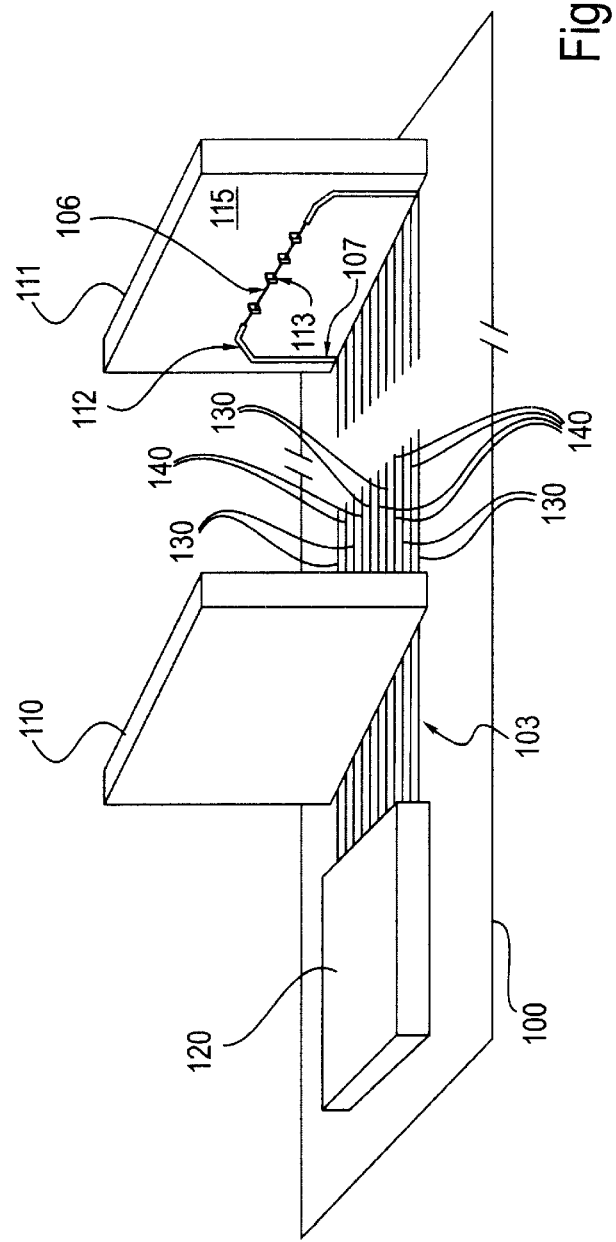
FIG. 4 illustrates an embodiment of a computer system that uses the continuity module of the present invention.

FIG. 4 illustrates an embodiment of the present invention as implemented in a computer system. Mounted onto motherboard 100 are memory controller 120 and sockets (not shown) for receiving either a memory module or a continuity module. In this embodiment, memory module 110 is inserted into one of those sockets. Memory module 110 may contain a number of high speed Rambus DRAMS. (Other types of DRAMs may be used instead—even with a bus customized for RDRAMs, if accompanied by an appropriate signal translation mechanism.)

Motherboard 100 supports interconnect 103. Interconnect 103 includes several signal traces 130 and several reference traces 140 that extend from memory controller 120 to memory module 110, and from memory module 110 to continuity module 111. Continuity module 111 (inserted into another socket mounted to motherboard 100) includes PCB 115, which includes signal trace 112. Trace 112 includes vias 113. In this embodiment, continuity module 111 serves as a bridging element that enables signals to be transmitted from memory controller 120, through memory card 110, and to the termination resistors (not shown). The presence of vias 113 increases the capacitance applied to trace 112. As mentioned above, adding vias, while retaining a fixed width for the trace, would create impedance discontinuities in trace 112. To prevent this result, in this embodiment, trace 112 includes relatively thin sections 106 and relatively thick sections 107. Like the structure shown in FIG. 2, thin sections 106 of trace 112 are located between thick sections 107 and vias 113. (The number of layers included in PCB 115 of continuity module 111 may vary, and is a matter of design choice. Preferred embodiments include a six or eight layer PCB.)

A capacitively loaded continuity module has been described. That module includes traces that are coupled to a capacitive load. As explained above, adding capacitance to those traces can help attenuate fast edge rate signals by acting as a low pass filter that filters out the high frequency portion of those signals. The embodiments illustrated here demonstrate that a trace, formed on a continuity module, can be capacitively loaded in a cost effective manner using only PCB routing. No additional components are required. As a consequence, these examples demonstrate that such a component may be produced in a high volume manufacturing environment in a cost effective manner.

Features shown in the above referenced drawings are not intended to be drawn to scale, nor are they intended to be shown in precise positional relationship. Additional features that may be integrated into the continuity module of the present invention have been omitted, when not useful to describe aspects of the present invention. Although the foregoing description has specified a continuity module that includes certain features, those skilled in the art will appreciate that many modifications and substitutions may be made. For example, vias and stubs may assume various shapes and sizes. This invention, of course, comprehends adding capacitive loading to a trace routed through a continuity module in ways other than those described here. Accordingly, it is intended that all such modifications, alterations, substitutions and additions be considered to fall within the spirit and scope of the invention as defined by the appended claims.

What is claimed is:

1. A continuity module for a memory channel for a computer system comprising:

a connecting member for coupling the continuity module to a socket coupled to a motherboard;

a printed circuit board coupled to the connecting member, the printed circuit board including a signal trace; and a capacitive load, which comprises a plurality of stub traces that are coupled to the signal trace, wherein the stub traces are oriented substantially perpendicular to the signal trace and wherein the signal trace comprises relatively thin sections and relatively thick sections, the relatively thin sections being located between the relatively thick sections and the stub traces.

2. A computer system comprising:

a memory controller;

a dynamic random access memory, wherein the dynamic random access memory comprises a Rambus DRAM;

a socket coupled to a motherboard for receiving a memory module; and a continuity module that comprises:

a connecting member for coupling the continuity module to the socket;

a printed circuit board coupled to the connecting member, the printed circuit board including a signal trace; and a capacitive load, which comprises a plurality of stub traces that are coupled to the signal trace, wherein the stub traces are oriented substantially perpendicular to the signal trace and wherein the signal trace comprises relatively thin sections and relatively thick sections, the relatively thin sections being located between the relatively thick sections and the stub traces.

* * * * *